INVENTORS
EMIL W. HINSPATER
PAUL C. OPPELT
BY Leonard G. Nierman
ATTORNEY

United States Patent Office 2,846,659

Patented Aug. 5, 1958

2,846,659

SOLDERING TERMINAL ASSEMBLY

Emil William Hinspater, McHenry, and Paul C. Oppelt, Chicago, Ill., assignors to Nuclear-Chicago Corporation, a corporation of Delaware Application October 14, 1953, Serial No. 385,964

4 Claims. (Cl. 339—198)

This invention relates to an improved electrical contact assembly. More specifically, the invention relates to the construction and fabrication of soldering terminal assemblies of the form commonly known as "terminal boards."

In the modern manufacture of electronic equipment, it has been an increasingly common practice to fabricate portions of the equipment in subassemblies which are subsequently assembled into the main equipment assembly, usually by the soldering of leads provided for the purpose, but sometimes by mere plugging into sockets provided for the purpose. Where networks of components such as resistors, condensers and coils are to be incorporated in electronic equipment, particularly equipment of a precision nature, it is now common to prefabricate such networks by assembling and soldering the network components on terminal boards, which are in general insulating plates bearing conducting lugs to which the wire leads of the electrical components are soldered in the desired manner. Such subassemblies are made prior to, and independently of, incorporation of the network into the ultimate circuit and the latter operation is accomplished by merely securing the terminal board to the chassis and soldering the network connections to the appropriate components, such as socket terminals, etc., on the chassis; alternatively, such subassemblies may be both mounted and electrically connected by providing the assembly and the chassis respectively with an appropriate plug and socket.

Prior to the present invention, the fabrication of terminal boards suitable for the making of such subassemblies has been relatively expensive and has in most cases required special machinery for the installation of the conducting terminals in the insulating boards. Thus the use of such terminal boards has been limited to operations in which the volume of any special design (size, number and spacing of terminals, etc.) was sufficient to justify the setting up of machinery for the purpose, or to the use of "stock" boards, with the attendant lack of adaptation of the size of the board and the number and spacing of individual terminals to the particular circuit needs. Thus in case of experimental construction of electronic equipment or even in case of small scale production thereof, the employment of terminal boards of a size and design specifically adapted for the purpose at hand was virtually prohibitive, since both the expense and the setting up of the machinery necessary or desirable for this purpose would not permit such use.

It is the principal object of the present invention to provide a terminal board assembly which is simply fabricated from commonly available stock with simple and inexpensive equipment, and which nevertheless is not only durable and electrically sound, but is additionally easy to use in assembling electrical components thereon and soldering the leads thereo. The invention also provides, as a corollary, a simple method of fabricating terminal assemblies and terminal boards, which may readily be practiced even in small shops and laboratories to produce terminal boards of any particular layout desired for a particular application.

In general, the soldering terminal assembly of the invention may be described as an apertured plate similar to those previously used for such assemblies, together with a hollow conducting generally tubular terminal seated in the aperture and extending from both faces of the plate, the terminal being flared at its ends, and at least one of the extending ends thereof having an elongated outer surface for the winding of wires thereon and an inner diameter larger than that of the portion within the plate. By this construction, the terminal is securely locked in the plate, and wires may be soldered both within and upon the terminal, which results in a considerable saving of both space and expense where the terminals must be designed for the attachment of a large number of leads thereto. The method of making the terminal is also extremely simple, requiring no machinery which is not generally available even in small shops. In the present method, in general, the soldering terminal assembly is fabricated by merely seating the central portion of a cylindrical tubular terminal member in an aperture in an insulating plate and thereafter simultaneously expanding the diameters of both ends of the terminal member while leaving the ends substantially spaced from the plate to form cup-shaped interior and exterior soldering surfaces, at the same time locking the terminal in the plate. As a refinement of the method thus generally described, the outer ends or lips of the cup-shaped surfaces are further expanded to form flanges thereon to prevent the slipping off of wires which have been wound thereon preparatory to soldering.

For a more complete understanding of the invention reference is made to the embodiment thereof illustrated in the attached drawing in which.

Figures 1, 2, 5, 6:
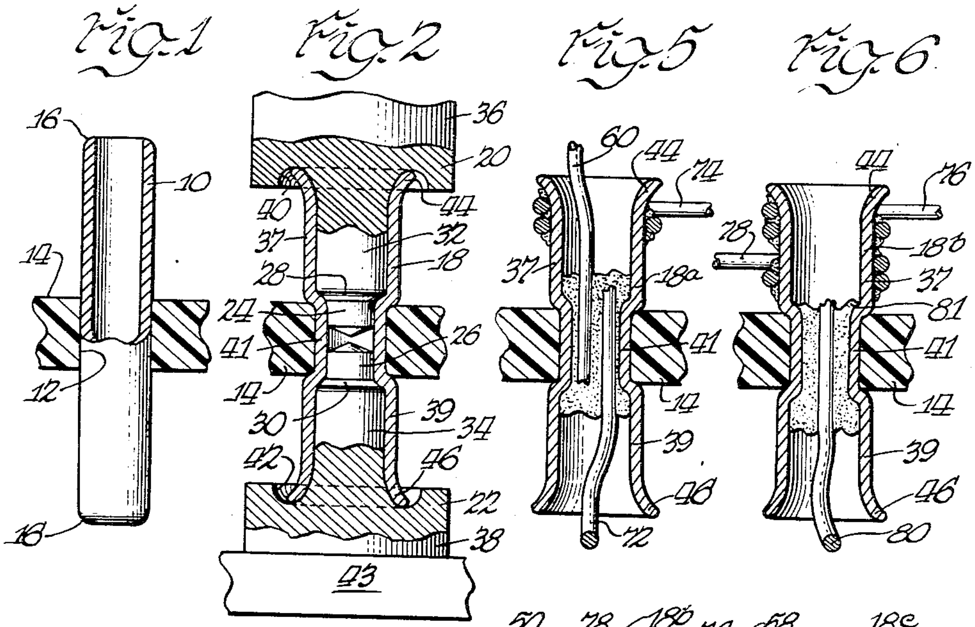
Fig. 1 is a fragmentary sectional view of a tubular terminal blank seated in an insulating board or plate prior to formation thereof in accordance with the invention.
Fig. 2 is a fragmentary sectional view illustrating the manner of formation of the assembly of the invention.
Fig. 5 is an enlarged detailed sectional view of a soldering lug or terminal assembly indicated by the circle 5 of Fig. 4.
Fig. 6 is a similar view of the soldering lug assembly indicated by the circle 6 of Fig. 4.

Referring first to Fig. 1, the terminal blank 10, comprising a tube of malleable conducting material, for example soft annealed brass, is seated in a snugly fitting aperture 12 in an insulating plate 14, fabricated of a phenolic plastic. Exemplary dimensions of the blank 10 are .575 inch length, .125 inch outer diameter and .078 inch inner diameter. The edges of the tubing are "broken" or rounded at 16, as by a tumbling operation. This formation permits simple manual insertion of the blank 10 into the snugly fitting aperture and also simplifies the subsequent formation of a flange later to be described.

The terminal or lug 18 is formed from the tubular blank 10 as shown in Fig. 2. There are applied to the opposite ends of the blank 10 identical piercing or expanding tools 20 and 22. The tools are formed with pointed leading ends 24 and 26 substantially identical in diameter with the inner diameter of the blank 10, bevelled piercing or expanding portions 28 and 30, and shank portions 32 and 34 of greater diameter than the leading ends 24 and 26. The shanks 32 and 34 terminate in butt portions 36 and 38 of yet greater diameter. Annular grooves 40 and 42 of curved cross-section surround the inner ends of the shank portions 32 and 34 in the outer ends of the butt portions 36 and 38 to form smooth re-entrant surfaces. When the tools 20 and 22 are applied as illustrated, the diameters of both ends of the blank 10 are expanded to form outwardly facing substantially identical cups 37 and 39 connected by a central or neck portion 41. In the last portion of the relative motion between the tools, the outer ends or lips of the terminal are further expanded to form flanges 44 and 46 by the grooves 40 and 42.

As illustrated, the lower tool 22 rests on an anvil 43, which may be the anvil of a riveting machine, or if desired, the operation may be performed manually, as with a hammer. It will be noted that the force required for proper shaping of the lug 18 is not critical. The rounded shape of the grooves 40 and 42 produces the result that variation in the force applied in the piercing or spreading operation results merely in slight variation of the size of the lips or flanges 44 and 46, thus assuring that the application of forces of greater or lesser magnitude will nevertheless produce properly formed lugs. The rounding or breaking at 16 on the blank 10 permits the formation of the lips 44 and 46 without the necessity of exerting the greater force which would be necessary for this purpose otherwise. It will be noted additionally that whatever forces are applied to the tools 20 and 22 are automatically applied equally to both the lower and upper ends of the lug 18, so that symmetrical form is achieved without the use of particular care in this respect in fabrication, thus contributing to the overall simplicity and lowering of cost of the soldering terminal assembly of the invention.

Figures 3, 4:
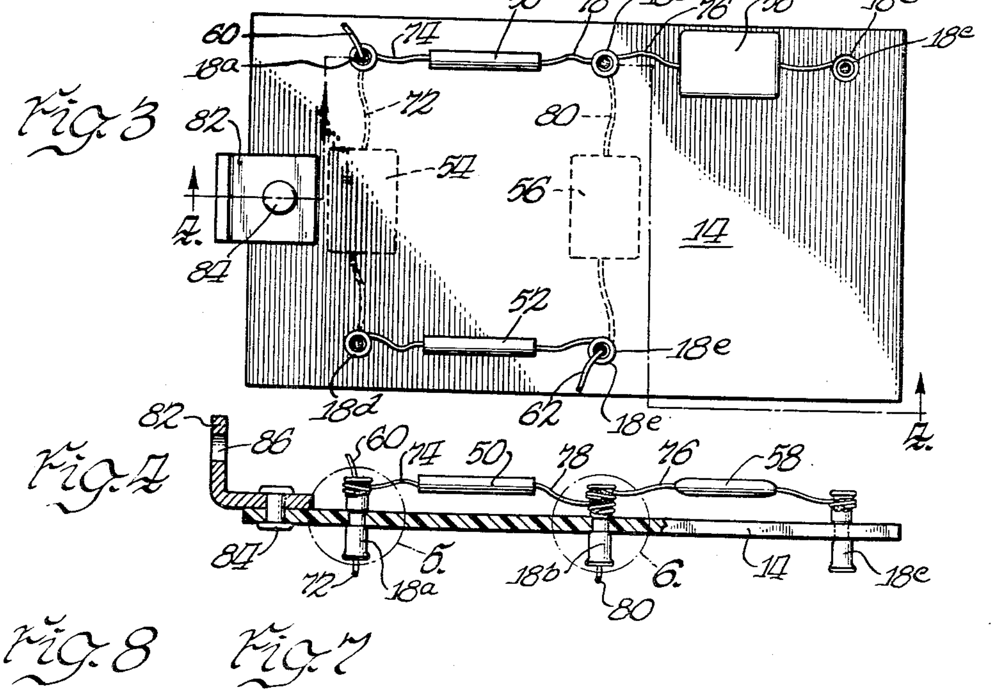
Fig. 3 is a plan view of a terminal board constructed in accordance with the invention, illustrating resistors, condensers and leads secured thereto.
Fig. 4 is a sectional view, partly in elevation, taken along the line 4—4 of Fig. 3.

In Figs. 3 and 4 is illustrated a typical terminal board assembly made in accordance with the invention, together with electrical components mounted thereon in illustrative fashion. As shown in these Figures, there are attached to the insulating board or plate 14 a plurality of lugs 18, designated **18*a*, 18*b*, 18*c*, 18*d*, and 18*e*, each of which is formed and secured in the board 14 in the manner described above. Electrical components, in this case resistors 50 and 52 and condensers 54, 56 and 58, are connected on the board to form an illustrative electrical network, and wires 60 and 62** are connected to appropriate points in the network to lead to appropriate connection points (not illustrated) in an electrical circuit or equipment in which the network is to be incorporated.

As shown in Figs. 5 and 6, wire leads may be secured to the terminals of the invention in a plurality of ways, thus making possible the secure soldering to the terminals of a substantial number of leads, far greater than could be done with terminal lugs of corresponding size previously. As shown in these views, the wire leads, designated by the numerals 60, 72, 74, 76, 78 and 80 may be secured at either end of the lugs on the exterior surfaces, or may be inserted into one or both of the cup-shaped ends of the lug and soldered in the interior.

When the leads are wrapped on the exterior (one lead being secured in this fashion in Fig. 5 and two leads in Fig. 6) the lip or flange 44 (or 46) secures the wire lead on the exterior and prevents it from slipping off while the assembly operator is applying the solder. As regards the leads secured to the interior, the cup-shaped form of the ends 37 and 39 guides the melted solder into the neck or intermediate portion 41, thus permitting the making of neat and secure solder joints with a minimum of solder. The slight flow of solder past the narrowed neck portion, as seen at 81 in Fig. 6, locks the solder body into the lug, thus adding substantially to the security of the joint. The flares or flanges 44 or 46, together with the narrowing at the neck portion, permit the insertion of wires into the relatively narrow neck portion of the lug with a minimum of precision or care, and consequently with a minimum of cost in production operations.

Figure 7:
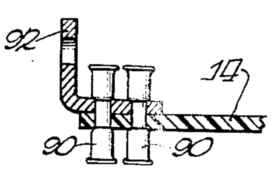
Fig. 7 is a fragmentary sectional view of an embodiment of the invention constituting a modification of that of Fig. 4.

As illustrated in Figs. 3 and 4, the assembly is provided with a conventional mounting bracket 82, of L-shaped cross-section, which is riveted to the board at 84 and is provided with an aperture 86 for bolting the board into position in an electronic chassis. In Fig. 7 is shown an alternative construction whereby lugs 90, formed in a manner similar to the lugs 18 described above, are employed to secure a mounting bracket 92, similar to the bracket 82, to the board. With this construction, the lugs 90 act as grounding lugs, since the bolting or other securing of the conducting bracket 92 to a conducting chassis grounds the lugs 90, and the making of ground connections may accordingly be easily done in the preassembly of subassemblies similar to those shown in Figs. 3 and 4.

Figure 8:
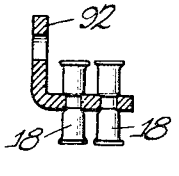
Fig. 8 is a sectional view of a grounding lug embodying one aspect of the invention.

In Fig. 8 is shown a grounding lug or bracket made in accordance with one aspect of the invention. In this embodiment the lugs 18 are merely mounted in a metal bracket 92, the formation and mounting being accomplished as described above. With this structure, there is provided a grounding lug or bracket which may be used independently of the type of terminal board assembly described above for providing ground connections, leads being secured thereto as also described above.

Obviously, persons skilled in the art will readily alter the embodiments of the invention shown and described herein in various forms which nevertheless preserve and utilize the essence of the teachings of the present invention. Accordingly, the scope of the patent protection conferred hereby shall not be deemed to be limited by the particular embodiments shown, but shall be determined only from the appended claims.

What is claimed is:

1. A soldering terminal assembly comprising an apertured plate and a tubular terminal extending through the plate and seated in the aperture therein, the terminal extending approximately equally from both faces of the plate, said extending portions of the terminal having elongated cylindrical outer portions of greater inner and outer diameter than the central portion and portions of diminishing diameter connecting the outer portions and the central portion to form outwardly facing cups connected by the central portion, the outer ends of the extending portion being substantially spaced from the plate whereby the terminal is locked in position by the exteriors of the extending portions, around which wires may be wound and soldered, and the cup-shaped interiors facilitate the insertion and soldering of wires therein.

2. A soldering terminal assembly comprising an apertured plate and an electrically conducting terminal having a central tubular neck portion seated in the aperture and substantially identical outwardly facing cup-shaped cylindrical end portions extending from the plate and of greater transverse dimension throughout their length than the central portion and the aperture, the outer ends of the cup-shaped portions being substantially spaced from the plate.

3. A soldering terminal assembly comprising an apertured plate and a tubular terminal extending through the plate and seated in the aperture therein, the terminal extending approximately equally from both faces of the plate, said extending portions of the terminal having elongated cylindrical outer portions of greater inner and outer diameter than the central portion and portions of diminishing diameter connecting the outer portions and the central portion to form outwardly facing cups connected by the central portion, the outer ends of the extending portion being substantially spaced from the plate and being flared at the extremities thereof.

4. A soldering terminal assembly comprising an apertured plate and an electrically conducting terminal having a central tubular neck portion seated in the aperture and substantially identical outwardly facing cup-shaped cylindrical end portions extending from the plate and of greater transverse dimension throughout their length than the central portion and the aperture, the outer ends of the cup-shaped portions being substantially spaced from the plate and being flared at the extremities thereof.

References Cited in the file of this patent

UNITED STATES PATENTS

| | | |
|---|---|---|
| 1,122,280 | Kempshall | Dec. 29, 1914 |
| 1,806,815 | Muther | May 26, 1931 |
| 1,900,099 | Ferguson | Mar. 7, 1933 |
| 1,914,651 | Reutter | June 20, 1933 |
| 2,211,659 | Johanson | Aug. 13, 1940 |
| 2,228,930 | Robinson | Jan. 14, 1941 |
| 2,258,750 | Eichwald | Oct. 14, 1941 |
| 2,386,171 | Wild | Oct. 2, 1945 |
| 2,414,897 | Rickmeyer | Jan. 28, 1947 |
| 2,456,118 | Foster | Dec. 14, 1948 |
| 2,533,483 | Losquadro | Dec. 12, 1950 |
| 2,547,866 | Hingelberg | Apr. 3, 1951 |
| 2,647,990 | Peterson | Aug. 4, 1953 |
| 2,671,889 | Vickery | Mar. 9, 1954 |